(12) United States Patent
Freund et al.

(10) Patent No.: US 6,290,805 B1
(45) Date of Patent: Sep. 18, 2001

(54) SYSTEM AND METHOD FOR USING A PICK AND PLACE APPARATUS

(75) Inventors: Joseph Michael Freund, Fogelsville; George John Przybylek, Douglasville; Dennis Mark Romero, Bethlehem, all of PA (US)

(73) Assignee: Agere Systems Optoelectronics Guardian Corp., Miami Lakes, FL (US)

( * ) Notice: Subject to any disclaimer, the term of this patent is extended or adjusted under 35 U.S.C. 154(b) by 0 days.

(21) Appl. No.: 09/398,188

(22) Filed: Sep. 17, 1999

(51) Int. Cl.[7] ............................ B32B 35/00; H01L 21/301
(52) U.S. Cl. ..................... 156/344; 156/584; 438/464; 438/976
(58) Field of Search ........................ 156/344, 584; 438/464, 976, FOR 386

(56) References Cited

U.S. PATENT DOCUMENTS

| | | | |
|---|---|---|---|
| 4,990,051 | * 2/1991 | Safabakhsh et al. | 156/344 |
| 6,017,804 | * 1/2000 | Freund et al. | 438/460 |
| 6,123,800 | * 9/2000 | Freund et al. | 156/344 |
| 6,165,310 | * 12/2000 | Freund et al. | 156/344 |

* cited by examiner

Primary Examiner—Mark A. Osele
(74) Attorney, Agent, or Firm—Dickstein Shapiro Morin & Oshinsky LLP

(57) ABSTRACT

A system is provided for removing large semiconductor work pieces from an adhesive film. A pick and place apparatus is provided with a collet bar with elongated sides and opposed ends. A channel extends into a cavity on a lower surface of the collet bar. The channel receives a vacuum. The collet bar is angled from a longitudinal axis of the larger work piece to be removed. The work piece may be aligned with a cylindrical roller located under the adhesive film. The angle is chosen to extend the bar across a majority of the width of the work piece. By lowering the collet bar, a first end contacts the work piece, which may be tilted on the roller. Further lowering of the collet bar tilts the semiconductor work piece up into the same plane as the lower surface of the collet bar.

18 Claims, 6 Drawing Sheets

SYSTEM AND METHOD FOR USING A PICK AND PLACE APPARATUS

FIELD OF THE INVENTION

The present invention generally relates to fabrication of semiconductor work pieces. More particularly, the present invention relates to a system and method for using a pick and place apparatus to move a fragile semiconductor work piece from a substrate.

BACKGROUND OF THE INVENTION

The manufacture of semiconductor and other electronic devices, hereinafter described as work pieces, generally includes steps such as sawing, scribing, breaking, sorting, inspecting, bonding, shipping, storage and additional processing. A number of tools and methods are employed to handle the delicate work pieces throughout such manufacturing processes.

One such method involves the use of a film that contains a pressure sensitive adhesive mounted in a vacuum frame. In this method, the work pieces are individually secured to the adhesive film by the force of the adhesive. The film securing the work pieces is secured to the frame through the application of negative pressure applied through vacuum holes. This arrangement has proven efficient and effective in handling work pieces throughout a variety of fabrication processes. Once processing is completed, however, significant problems exist in removing the fragile work pieces from the adhesive film.

One method for removing work pieces from the adhesive film involves moving the film over a rotatable roller such that the work piece rides up on the roller. A pick and place apparatus utilizing a vacuum has a bar which is aligned with a longitudinal axis of the work piece. A vacuum source exerts a force normal to the film through a channel opening in the bar, pulling the work piece from the film. This method has demonstrated a successful, i.e., undamaged, removal yield well in excess of ninety-nine percent for work pieces with dimensions no larger than 12 mils by 320 mils.

Greater functionality is being integrated into semiconductor work pieces, thus causing the need for work pieces of greater dimensions. The above-described method is less effective, resulting in a lowered removal yield, for these larger work pieces. The increased width of the larger work pieces allows the work pieces to tilt relative to the pick and place apparatus, preventing the apparatus from forming a sufficient vacuum seal on the work piece when the vacuum bar is aligned with the longitudinal axis of the work piece.

Increasing the downward force of the pick and place apparatus may cause damage to the work piece, thus lowering the removal yield. Alternatively, a pick and place apparatus may be fabricated with various size vacuum bars to handle the different size semiconductor work pieces. However, fabricating different size pick and place apparatuses would add cost to the semiconductor fabrication process, and would add downtime to the process necessary to swap out or exchange pick and place apparatuses. Thus, there exists a need for an improved method of removing semiconductor work pieces having larger dimensions.

SUMMARY OF THE INVENTION

The present invention provides a method of using a pick and place device having a collet bar with elongated sides and a channel in communication with a vacuum source. The method includes positioning the collet bar over a work piece having a longitudinal axis and a width, angling the elongated sides of the collet bar relative to the longitudinal axis of the work piece, and exerting an upwardly directed vacuum force on the work piece.

The present invention also provides a system for picking up and removing a work piece from a first position. The system includes a collet bar having opposed elongated sides and a channel. The work piece has a longitudinal axis, and the collet bar elongated sides are at a first angle from the longitudinal axis.

These and other features and advantages of the invention will be more clearly understood from the following detailed description of the invention which is provided in connection with the accompanying drawings.

DETAILED DESCRIPTION OF THE PREFERRED EMBODIMENTS

Figure 1:
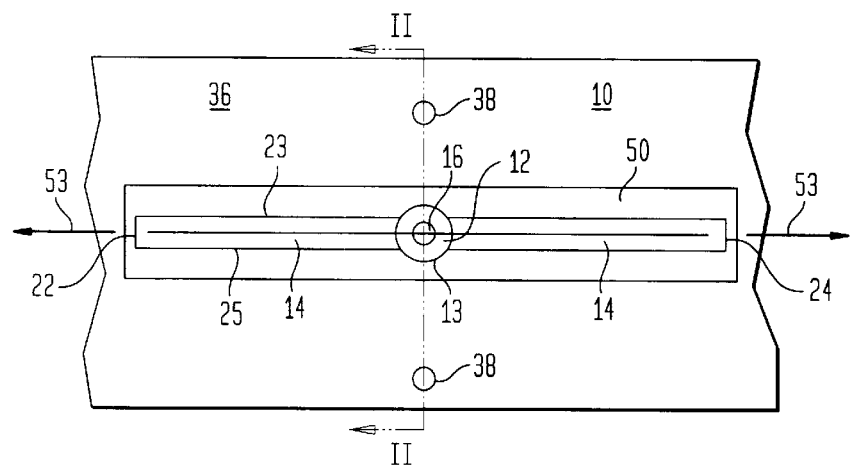
FIG. 1 is a top view of a pick and place apparatus constructed in accordance with an embodiment of the present invention.
Figure 2:
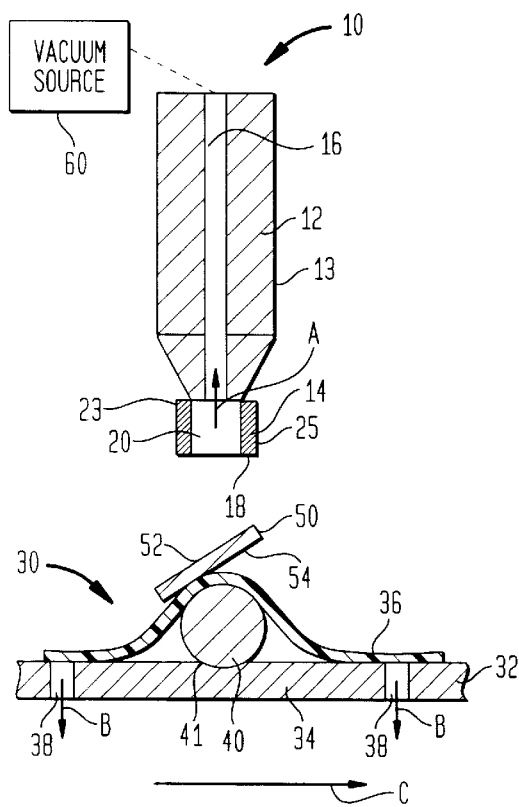
FIG. 2 is a cross-sectional view taken along line II—II of the pick and place apparatus of FIG. 1 located over a work piece.
Figure 3:
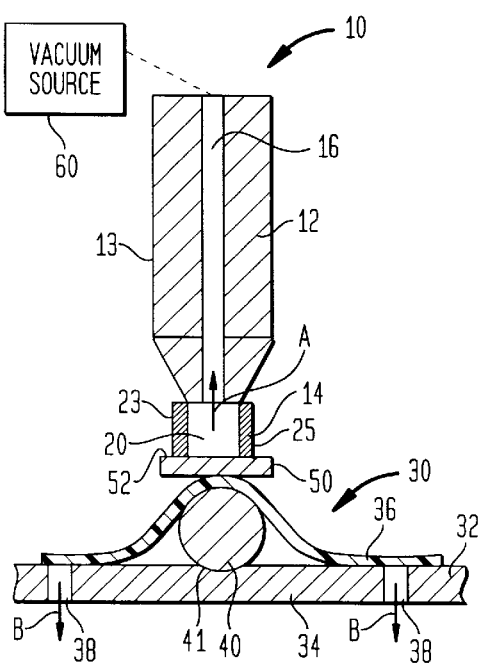
FIG. 3 is a cross-sectional view of the pick and place apparatus of FIG. 1 in contact with the work piece.

Referring now to FIGS. 1–3, there is shown a pick and place apparatus including a collet 12 and a pick and place fixture 30. The collet 12 has a collet stem 13 and a collet bar 14. The collet bar 14 includes a pair of opposed ends 22, 24 and a pair of elongated opposed sides 23, 25. The ends 22, 24 are parallel to each other, and the sides 23, 25 are parallel to each other. A cavity 20 is located within the collet bar 14 between the ends 22, 24 and the sides 23, 25. The collet bar 14 has a lower surface 18. A channel 16 extends through the collet stem 13 to the cavity 20. The channel 16 is sized and configured to receive a vacuum in the direction of arrow A from a vacuum source 60.

The pick and place fixture 30 includes a base 32, having a base surface 34, and an adhesive film 36. A plurality of holes 38 are located through the base 32. Each of the holes 38 is sized and configured to receive a vacuum in the direction of arrow B. The vacuum pulled through the holes 38 assists in securing the film 36 on the base surface 34. A rotatable rod 40 is positioned between the film 36 and the base surface 34. As illustrated, the rod 40 fits within a trough 41 in the base 32.

The film 36 is pulled along the base surface 34 in the direction of arrow C by a pulling mechanism (not shown). The movement of the film 36 along the base surface 34 allows semiconductor work pieces 50, which are mounted on the film 36, to individually ride up on top of the rod 40.

The work pieces 50, which have a longitudinal axis 53, each include a first surface 52 and a second surface 54. The second surface 54 is in contact with the adhesive film 36. Each of the semiconductor work pieces 50 has dimensions of about 12 microns by about 320 microns, or smaller.

When a work piece 50 is positioned on top of the rod 40, the pick and place apparatus 10 is lowered into contact with the work piece 50. Specifically, the lower surface 18 of the collet bar 14 is placed into contact with the first surface 52 of the work piece 50 such that the elongated sides 23, 25 are parallel to the longitudinal axis 53 of the work piece 50. Since the work piece 50 is positioned on a concave structure, i.e., the rotatable rod 40, the portion of the second surface 54 actually in contact with the film 36 is less than when the work piece 50 is positioned on the base 32. A minimal vacuum force from the vacuum source 60 is pulled through the channel 16 in the direction of arrow A, thereby lifting the work piece 50 from the film 36. Preferably, the amount of vacuum force is no more than ten grams.

Figure 4:
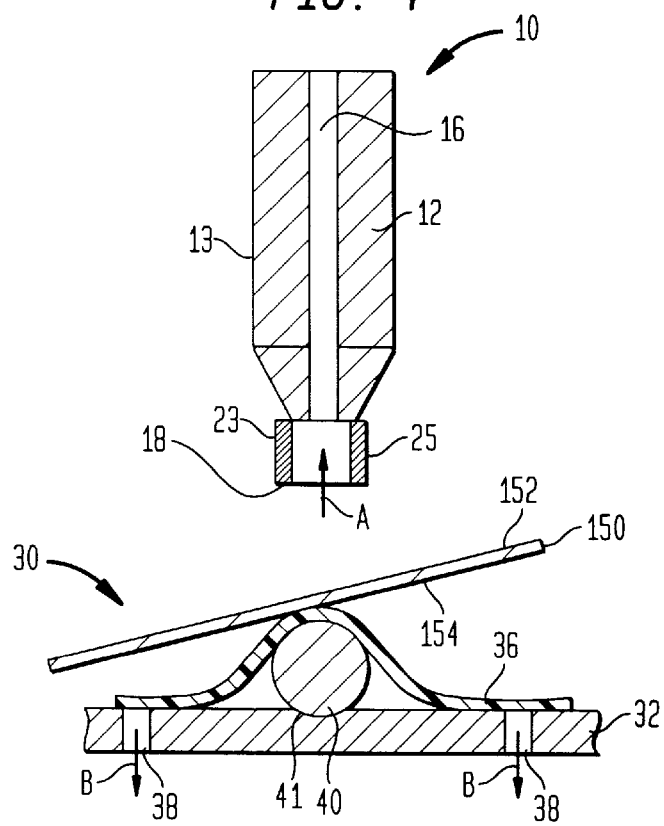
FIG. 4 is a cross-sectional view of the pick and place apparatus of FIG. 1 over a work piece having a greater width.
Figure 5:
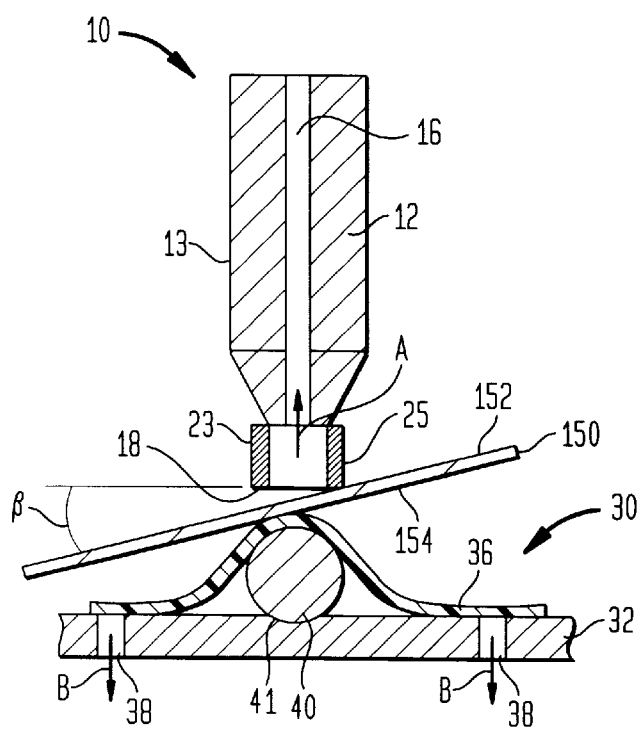
FIG. 5 is a cross-sectional view of the pick and place apparatus of FIG. 4 in contact with the work piece having a greater width.
Figure 6:
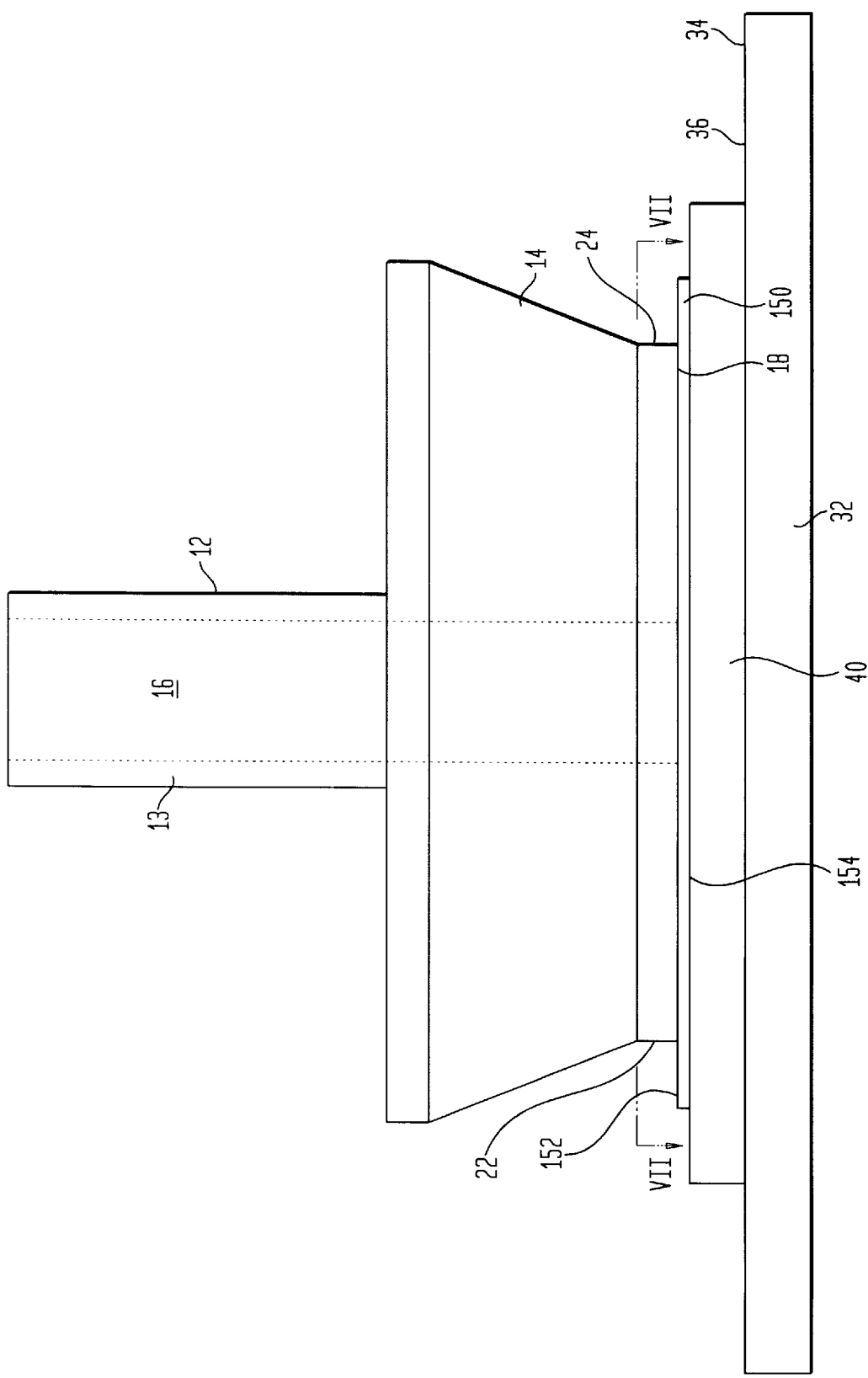
FIG. 6 is a side view of a pick and place apparatus in contact with a work piece having a greater width in accordance with an embodiment of the invention.

FIGS. 4–5 show the pick and place apparatus 10 attempting to remove a work piece 150, having greater lateral dimensions than the work pieces 50, from the film 36. As with the work pieces 50, the semiconductor work piece 150 has a first surface 152 and a second surface 154, the second surface 154 being in contact with the film 36. A longitudinal axis 153 of the semiconductor work piece 150 is parallel to the longitudinal axis of the rotatable rod 40 (FIG. 7).

After positioning the pick and place apparatus 10 above the rotatable rod 40, the apparatus 10 is lowered such that the lower surface 18 of the collet bar 14 comes into contact with the first surface 152 of the work piece 150. The collet bar 14 is aligned along the longitudinal axis 153 of the work piece 150 and the longitudinal axis of the rotatable rod 40. Neither the downward force exerted by the pick and place apparatus 10 nor the vacuum exerted in the direction of arrow A are sufficient to allow a seal to be formed between the pick and place apparatus 10 and the work piece 150. Instead, the work piece 150 remains at an angle beta ($\beta$) from the lower surface 18 of the collet bar 14.

Referring now to FIGS. 6–10, next will be described a system utilizing the pick and place apparatus 10 with semiconductor work pieces 150. As shown, each of the ends 22, 24 has a width $W_b$. The width $W_b$ is preferably between about six mils and about ten mils. Further, each of the elongated sides 23, 25 of the collet bar 14 has a length $L_b$, the length $L_b$ preferably being between about 225 mils and about 350 mils. The semiconductor work piece 150 has a width $W_p$. The width $W_p$ is preferably greater than about 250 mils, but no more than about 1500 mils.

Figure 7:
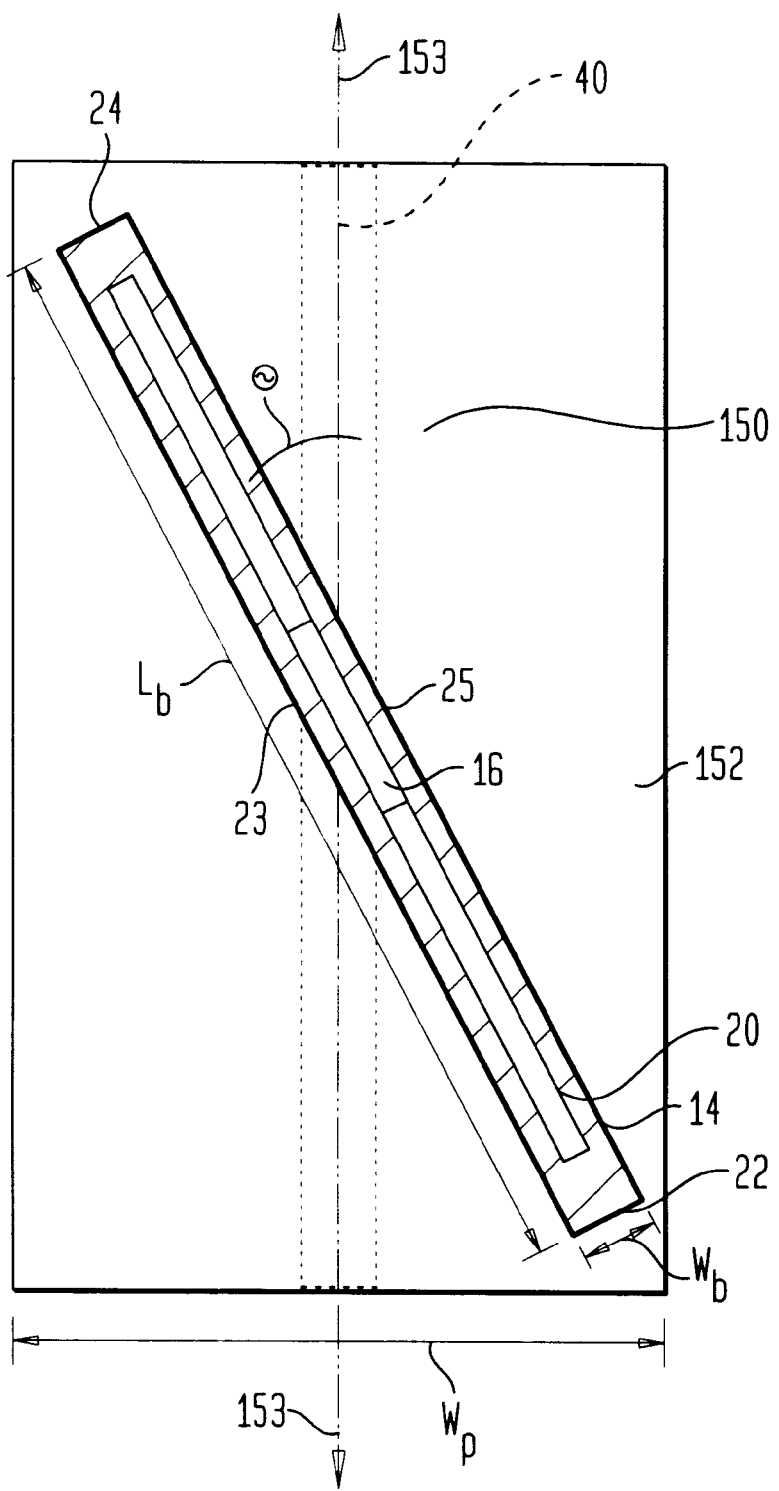
FIG. 7 is a cross-sectional view taken along line VII—VII of FIG. 6.
Figure 8:
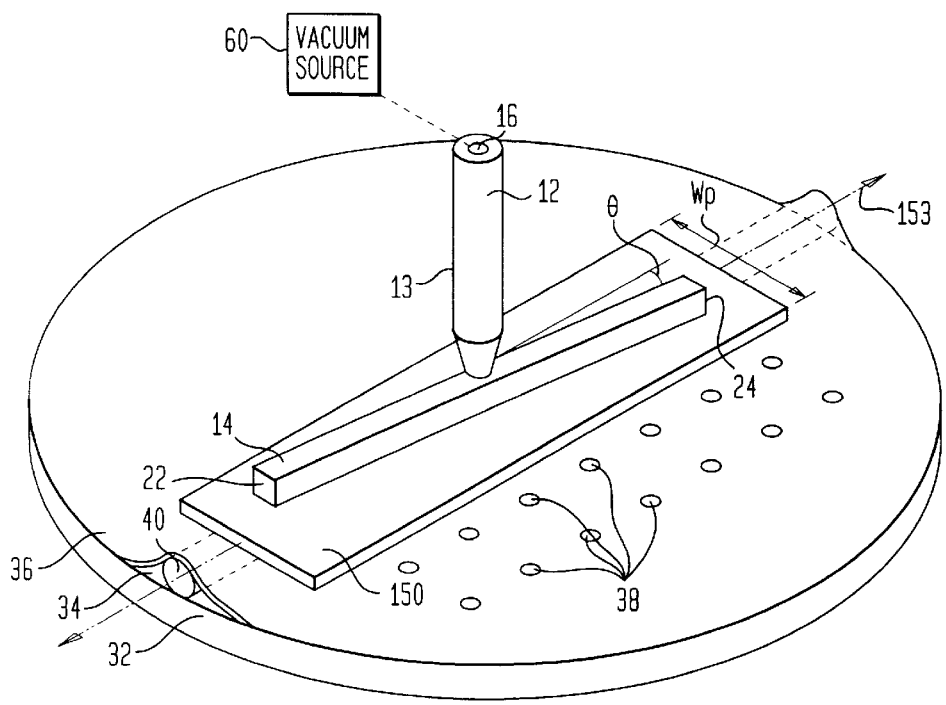
FIG. 8 is a perspective view of the pick and place apparatus of FIG. 6.

As shown in FIGS. 7–8, the collet bar 14 is angled from the longitudinal axis 153 of the work piece 150. Specifically, the collet bar 14 is at an angle theta ($\theta$) from the longitudinal axis 153 of the work piece 150. The angle $\theta$ is chosen to allow the collet bar 14 to extend across a larger surface area of the semiconductor work piece 150. Preferably, the collet bar 14 extends over a majority of the width $W_p$ of the work piece 150.

By angling the collet bar 14 relative to the longitudinal axis 153, the channel 16 as well as the cavity 20 cover a larger width of the work piece 150, thereby enhancing the ability to create a vacuum seal between the collet bar 14 and the work piece 150.

Figure 9:
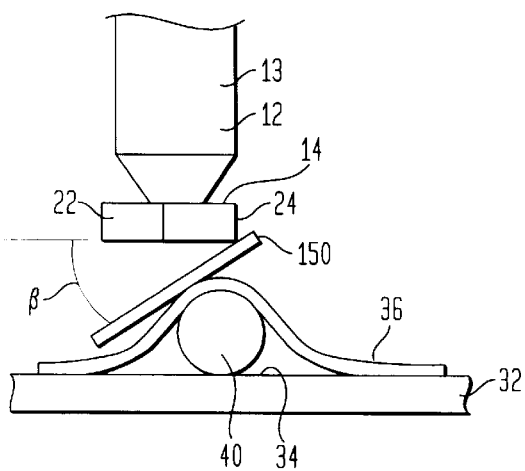
FIG. 9 is a side view of the pick and place apparatus of FIG. 6 making contact with the work piece having a greater width.
Figure 10:
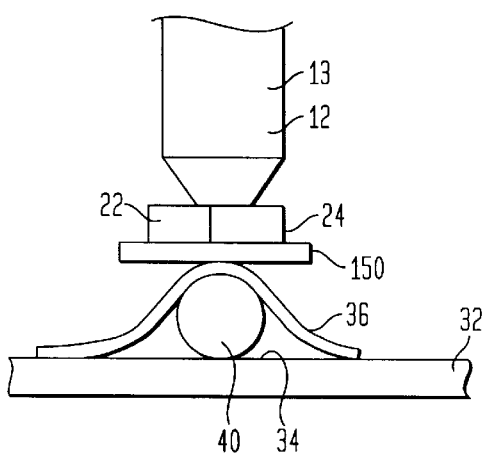
FIG. 10 is a side view of the pick and place apparatus of FIG. 6 in complete contact with the work piece having a greater width.

Further, the angled collet bar 14 assists in reducing the tilt of the semiconductor work piece 150. As shown in FIG. 9, the work piece 150 is at an angle $\beta$ from the collet bar 14. Upon lowering the pick and place apparatus 10, one of the ends, here end 24, of the collet bar 14 comes into initial contact with the semiconductor work piece 150. Further lowering of the pick and place apparatus 10 will serve to reduce the tilt, or planarize, the work piece 150, thereby reducing the angle $\beta$. Upon contact with the semiconductor work piece 150 by the second end 22, the work piece 150 is completely planarized and the angle $\beta$ has been reduced to zero, as shown in FIG. 10.

Figure 11:
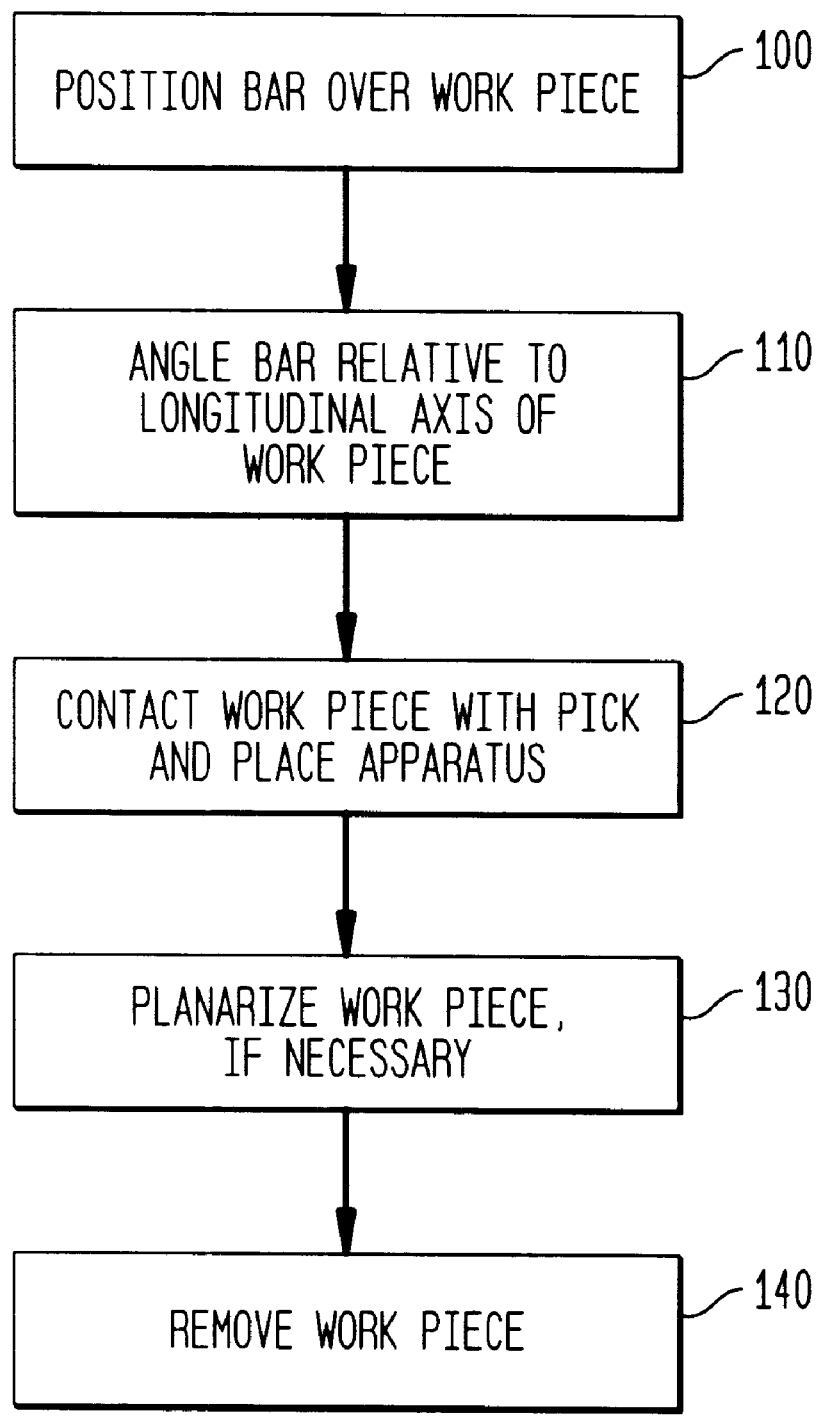
FIG. 11 is a flow chart for a method of using a pick and place apparatus to pick up a work piece having a greater width.

Referring to FIG. 11, next will be described a method for using the pick and place apparatus 10 with the semiconductor work pieces 150. The collet bar 14 is initially positioned over the work piece 150 at step 100. During step 100, the work piece 150 is adhered to the film 36. The bar 14 is then angled relative to the longitudinal axis 153 of the work piece 150 (step 110). The pick and place apparatus 10 is then lowered into contact with the work piece 150 at step 120. If necessary, at step 130, the work piece 150 is planarized relative to the collet bar 14. Then, at step 140, the work piece 150 is removed from the film 36. It is to be understood that steps 100 and 110 can be reversed from the order described above.

While the invention has been described in detail in connection with preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. A method of using a pick and place device, said method comprising the steps of:
   positioning a vacuum device over a work piece having a longitudinal axis and a width;
   locating the sides of the vacuum device at a non-zero angle relative to the longitudinal axis of the work piece; and
   exerting vacuum force on the work piece.

2. The method of claim 1, wherein said locating step includes the step of extending the sides of said vacuum device across a majority of the width of the work piece.

3. The method of claim 2, wherein the width of said vacuum device is between about six and about ten mils and the length of the sides is between about 225 and about 350 mils.

4. The method of claim 3, wherein said force is no greater than about ten grams.

5. The method of claim 4, wherein the work piece width is between about 250 mils and about 1500 mils.

6. The method of claim 1, wherein the positioning step precedes the locating step.

7. The method of claim 1, wherein the positioning and locating steps precede the force exerting step.

8. The method of claim 1, wherein the work piece is positioned on a roller mechanism at a second angle from a lower surface of said vacuum device, and wherein said method further comprises the step of reducing the second angle to zero.

9. The method of claim 8, wherein said angle reducing step comprises:

causing one portion of the vacuum device to contact the work piece; and subsequently, rotating the work piece and causing another portion of the vacuum device to contact the work piece.

10. A pick and place system attached to a work piece, said system comprising a collet bar having a pair of opposed parallel sides and a channel, wherein the work piece has a longitudinal axis, said collet bar sides being at a non-zero angle from the longitudinal axis.

11. The system of claim 10, wherein said sides extend across a majority of a width of the work piece.

12. The system of claim 11, wherein a width of the collet bar is between about six and about ten mils and a length of the sides is between about 225 and about 350 mils.

13. The system of claim 12, wherein the work piece width is between about 250 mils and about 1500 mils.

14. The system of claim 10, wherein the work piece is initially at a second angle from a lower surface of said collet bar.

15. The system of claim 14, wherein said collet bar includes opposed first and second ends, said second angle being reduced by initial contact of said first end with a portion of the work piece and subsequent contact of said second end with another portion of the work piece.

16. A pick and place system attached to a work piece having a longitudinal axis, said system comprising:

a collet bar having a pair of opposed parallel sides, a pair of opposed parallel ends, and a channel;

an adhesive material upon which said work piece is located; and a rotatable rod positioned beneath said adhesive material, wherein said work piece is initially at an angle from a lower surface of said collet bar, said angle being reduced to zero upon complete contact between said collet bar and said work piece.

17. The system of claim 16, wherein said rod is positioned within a trough in a support structure, said adhesive material being in contact with said support structure.

18. The system of claim 17, wherein said support structure includes openings for applying a vacuum to said adhesive material.

* * * * *